United States Patent
Chandra et al.

(10) Patent No.: US 9,936,572 B2
(45) Date of Patent: Apr. 3, 2018

(54) DIFFERENTIAL TRACE PAIR SYSTEM

(71) Applicant: Dell Products L.P., Round Rock, TX (US)

(72) Inventors: Umesh Chandra, Santa Cruz, CA (US); Henry M. Wolst, Santa Rosa, CA (US)

(73) Assignee: Dell Products L.P., Round Rock, TX (US)

( * ) Notice: Subject to any disclaimer, the term of this patent is extended or adjusted under 35 U.S.C. 154(b) by 103 days.

(21) Appl. No.: 14/793,447

(22) Filed: Jul. 7, 2015

(65) Prior Publication Data

US 2017/0013716 A1 Jan. 12, 2017

(51) Int. Cl.
*H05K 7/00* (2006.01)
*H05K 1/02* (2006.01)
*H01B 7/08* (2006.01)
*H02G 3/04* (2006.01)
*H05K 1/11* (2006.01)
*H05K 3/34* (2006.01)

(52) U.S. Cl.
CPC ........... *H05K 1/025* (2013.01); *H05K 1/0245* (2013.01); *H05K 1/111* (2013.01); *H05K 3/341* (2013.01); *H05K 2201/09227* (2013.01); *H05K 2201/09727* (2013.01); *H05K 2201/10189* (2013.01)

(58) Field of Classification Search
CPC .................. H05K 1/0245; H05K 2201/09727
USPC ......... 361/748, 760, 777; 174/70 C; 333/238
See application file for complete search history.

(56) References Cited

U.S. PATENT DOCUMENTS

| | | | | |
|---|---|---|---|---|
| 6,909,052 B1 * | 6/2005 | Haug | ................... | H05K 1/0224 174/255 |
| 2006/0197625 A1 * | 9/2006 | Kashiwakura | ....... | H05K 1/0245 333/33 |
| 2009/0058567 A1 * | 3/2009 | Dutta | ................... | H01L 23/5383 333/238 |
| 2012/0269522 A1 * | 10/2012 | Kagaya | ................... | H01P 3/026 398/183 |

* cited by examiner

*Primary Examiner* — Binh Tran
(74) *Attorney, Agent, or Firm* — Haynes and Boone, LLP

(57) ABSTRACT

A differential trace pair system includes a board having a first board structure member and a second board structure member. A differential trace pair in the board includes a first differential trace pair portion of a first width outside the board structure, and a second differential trace pair portion of a second width extending through the board structure. A first outer edge and a second outer edge of the second differential trace pair portion define the second width that is less than the first width. A first board structure member channel is defined by the first outer edge adjacent the first board structure member, a second board structure member channel is defined by the second outer edge adjacent the second board structure member and the first and second board structure member channels provide a third width of the second differential trace pair portion that is less than the second width.

20 Claims, 11 Drawing Sheets

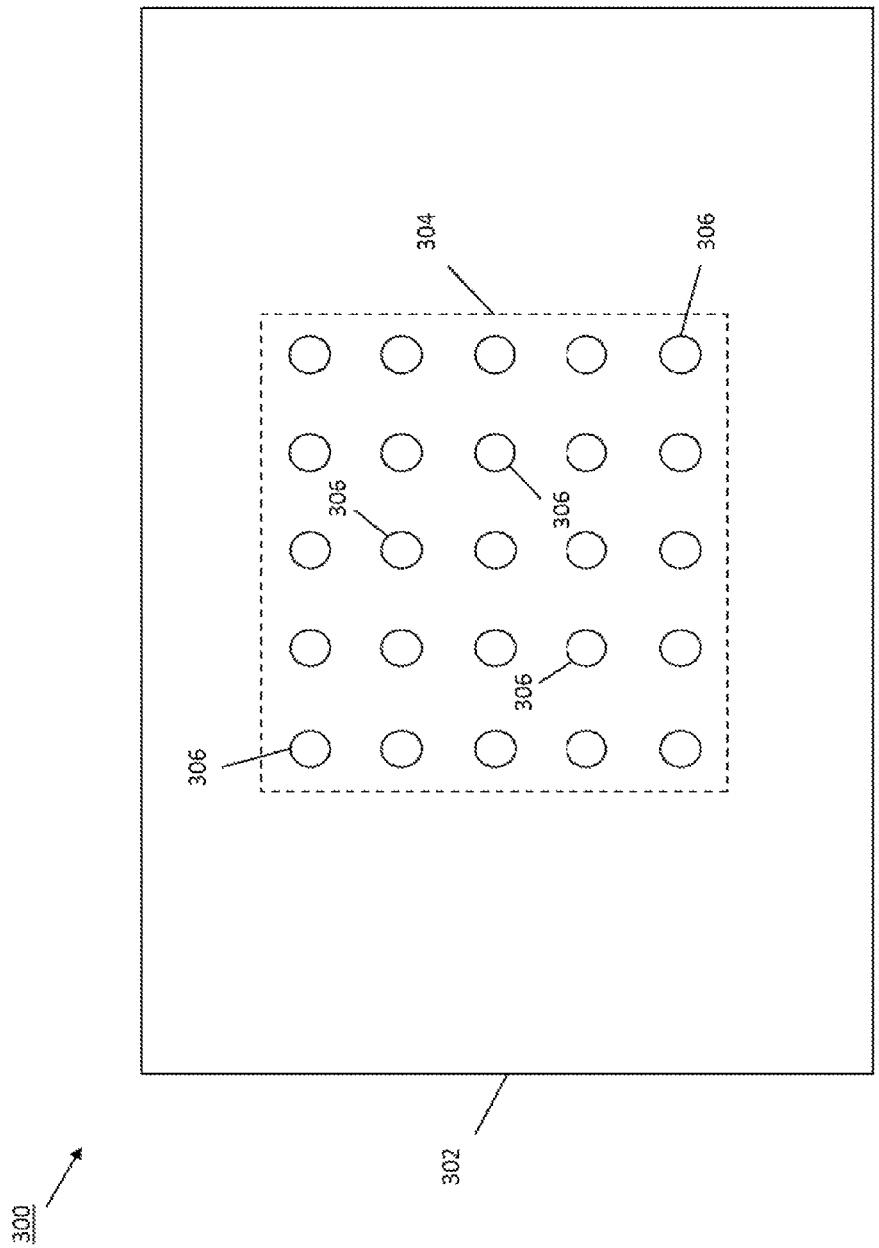

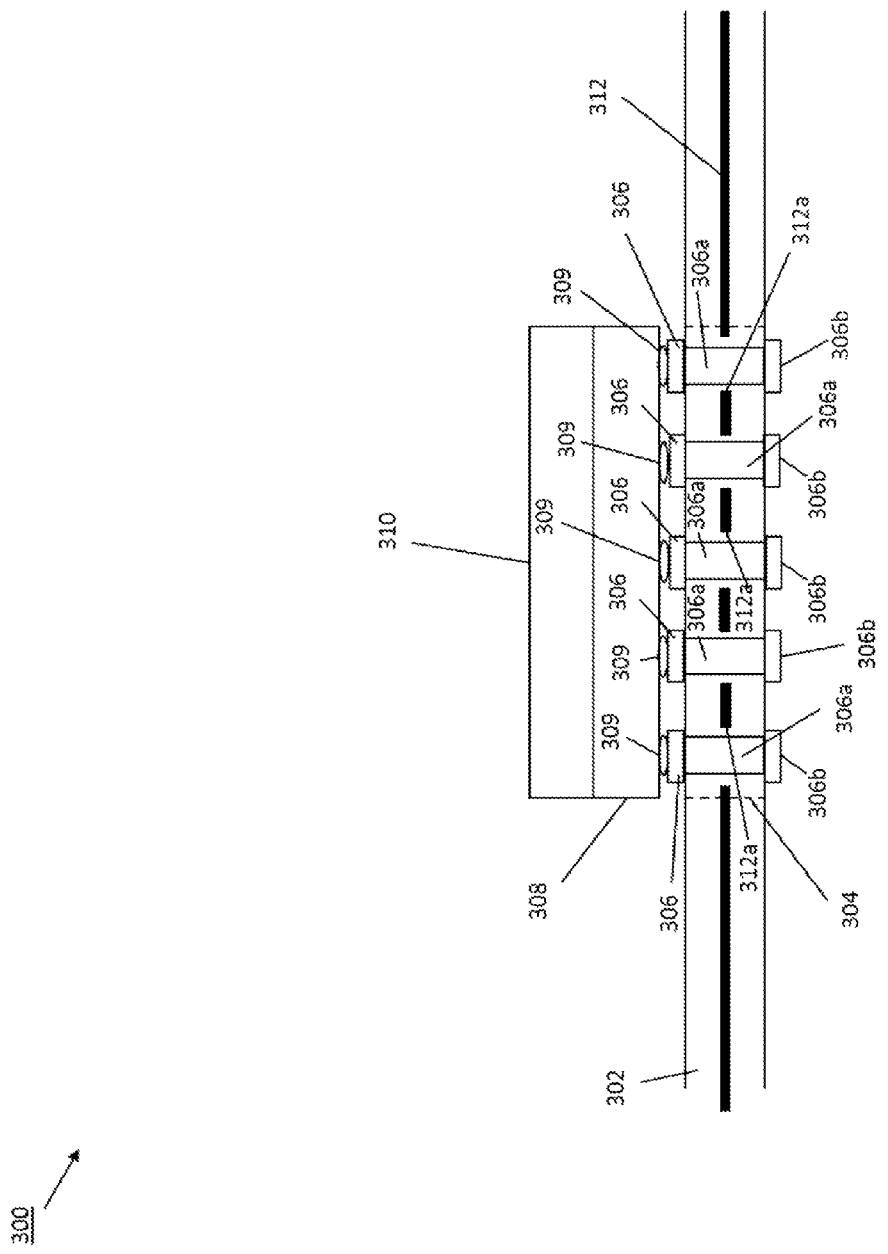

DIFFERENTIAL TRACE PAIR SYSTEM

BACKGROUND

The present disclosure relates generally to information handling systems, and more particularly to a differential trace pair system in an information handling system.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, switches, servers, and/or other information handling systems include circuit boards with communication traces that are provided in those circuit boards and connected to different subsystems in order to provide for the transmission of information between the subsystems. For example, a differential trace pair may be provided between a transmitter subsystem and a receiver subsystem in the switch or server (or between different switches and/or servers) to transmit and receive information. In some situations, the differential trace pair may couple to the transmitter subsystem and/or the receiver subsystem after being routed through a pin field such as, for example, a Ball Grid Array (BGA) pin field. Because the pins and associated vias in the circuit board that provide the BGA pin field are relatively closely spaced, the differential trace pair may require a "neck-down" region that includes a change in width of the differential trace pair that allows the differential trace pair to be routed between the pins/vias that are included in the BGA pin field. The provision of such neck-down regions in a differential trace pair can introduce some issues.

As the transmission of information using differential trace pairs is performed at higher and higher speeds, the widths of the traces in the differential trace pair must be increased in order to address losses. For example, for a 10 G transmission rate, the width and spacing of the traces in a differential trace pair is typically around 4-5.5 mils, while for a 25 G transmission rate with similar losses, the width and spacing of the traces in the differential trace pair is typically around 8 mils. When a differential trace pair is used to transmit information at a 25 G transmission rate and must also route through a BGA pin field, the spacing of pins/vias in the BGA pin field will not allow the width and spacing of the differential trace pair discussed above. Conventional solutions attempt to solve this problem by narrowing the traces in the differential trace pair. However, the manufacturing of such thinner differential traces raises several issues. For example, current manufacturing processes present difficulties in producing such thin traces. Furthermore, providing such differential traces at those widths can cause high impedance variations in the differential trace pair that, while not causing issues at 10 G transmission rates, can cause problems at 25 G transmission rates.

Accordingly, it would be desirable to provide an improved neck-down region in a differential trace pair.

SUMMARY

According to one embodiment, an information handling system (IHS) includes a processor; a circuit board having a connection pad array that couples the processor to the circuit board, wherein the connection pad array includes a first connection pad and a second connection pad that is spaced apart from the second connection pad; and a differential trace pair that is provided in the circuit board and that includes a first differential trace pair portion located outside the connection pad array and having a first width, and a second differential trace pair portion extending through the connection pad array and having a second width that is smaller than the first width, wherein the second differential trace pair portion includes: a first outer edge and a second outer edge that is located opposite the second differential trace pair portion from the first outer edge, wherein the first outer edge and the second outer edge define the second width; a first connection pad channel defined by the first outer edge adjacent the first connection pad; and a second connection pad channel defined by the second outer edge adjacent the second connection pad, wherein the first connection pad channel and the second connection pad channel provide a third width of the second differential trace pair portion that is smaller than the second width.

BRIEF DESCRIPTION OF THE DRAWINGS

FIG. 3a is a schematic view illustrating an embodiment of a board structure in the differential trace pair system of FIG. 2.

FIG. 3b is a schematic view illustrating an embodiment of the board structure of FIG. 3a coupled to a connector and a processing system.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. However, in particular embodiments, the 25+ Gb/s speeds discussed below may be provided in data centers by servers and switches via high speed differential links (e.g., server farms, network switch complexes, and/or other systems that transfer data such as video streams, encrypted bank transactions, scientific data, and/or other data known in the art that is subject to high speed transmission). The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
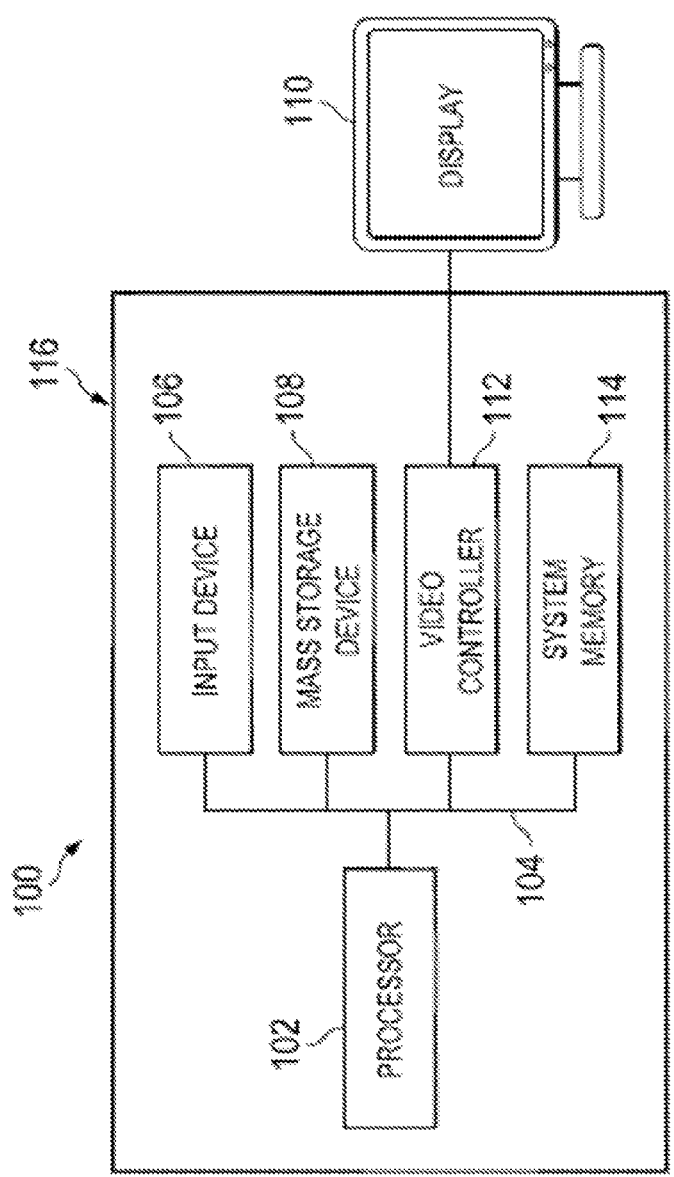
FIG. 1 is a schematic view illustrating an embodiment of an information handling system.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
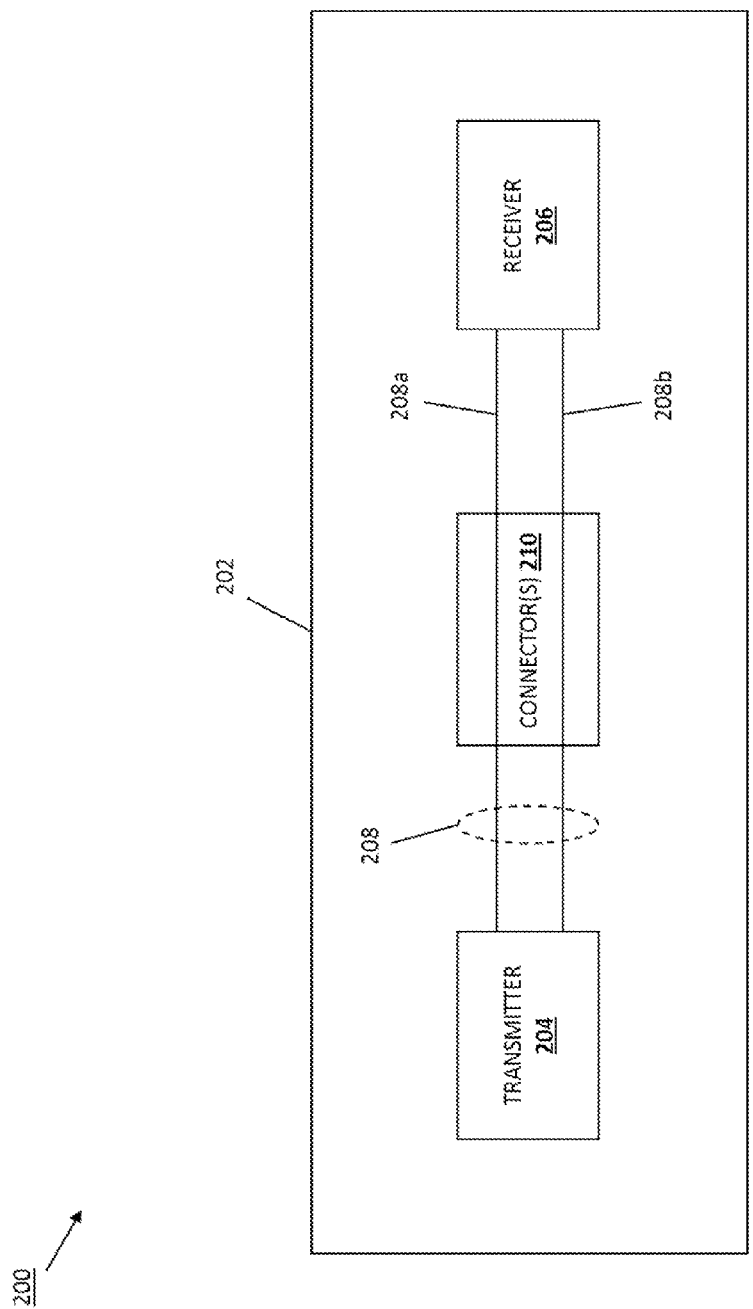
FIG. 2 is a schematic view illustrating a differential trace pair system.

Referring now to FIG. 2, an embodiment of a differential trace pair system 200 is illustrated. In an embodiment, the differential trace pair system 200 may be provided in the IHS 100 discussed above with reference to FIG. 1, and/or in one or more components of the IHS 100. In the illustrated embodiment, the differential trace pair system 200 includes a board 202 such as, for example, a circuit board that is provided to interconnect one or more components in the differential trace pair system 200. For example, a transmitter 204 and a receiver 206 may be mounted to the board 202 using a variety of couplings or connectors (e.g., surface mount technology (SMT) connectors and/or other connectors known in the art). In an embodiment, the transmitter 204 and/or the receiver 206 may be processing systems such as the processor 102 discussed above with reference to FIG. 1, communication systems, and/or other subsystems that communicate via differential trace pairs as is known in the art. A differential trace pair 208 that includes a first differential trace 208a and a second differential trace 208b is provided in the board 202 and extends through the board 202 between the transmitter 204 and the receiver 206.

As discussed below, the differential trace pair 208 may be routed in the board 202 through at least a portion of the transmitter 204 and/or the receiver 206 (and more specifically, through the board structures in the board 202 that are coupled to the transmitter 204 and/or the receiver 206). In the illustrated embodiment, one or more connecters 210 (e.g., surface mount technology (SMT) connectors and/or other connectors known in the art) may be coupled to the board 202 and the differential trace pair 208 may be routed in the board 202 through the connectors 210 (and more specifically, through the board structures in the board 202 that are coupled to the connectors 210). One of skill in the art in possession of the present disclosure will recognize that the differential trace pair system 200 has been greatly simplified for clarity of discussion, and a board may include many more transmitters, receivers, and connectors than have been illustrated, with many more differential trace pairs than have been illustrated, while remaining within the scope of the present disclosure. Furthermore, a wide variety of other board and system features that have been omitted for clarity may be provided in the differential trace pair system 200 while remaining within the scope of the present disclosure.

Referring now to FIGS. 3a and 3b, an embodiment of a board structure 300 is illustrated. In the embodiments discussed below, the board structure 300 is described as a connection pad array that may be used, for example, to couple or connect the transmitter 204, the receiver 206, and/or the connector(s) 210 to the board 202 in FIG. 2. However, in other embodiments, the board structure 300 may be other board structures such as, for example, system chassis structural members, non-conductive features or layers in the board, and/or a variety of other board structures known in the art. The board structure 300 includes a board 302, which may be the board 202 discussed above with reference to FIG. 2. A board structure area 304 is included on the board 302, and a plurality of board structure members 306 are provided in the board structure area 304. In the illustrated embodiment, the board structure 300 is a connection pad array and includes the board structure members 306 as connection pads that are provided in the board 302 in a symmetrical, spaced-apart array. However, in other embodiments, any orientation and/or positioning of board structure members is envisioned as falling within the scope of the present disclosure.

FIG. 3b illustrates a specific example of the board structure 300 as a connection pad array. As can be seen, each of the board structure members 306 (e.g., top connection pads in this embodiment) is coupled to a respective via 306a that is provided in the board 302 and that may be coupled and/or connected to one or more traces and/or other board features as is known in the art, as well as to a respective board structure members 306b (e.g., bottom connection pads in this embodiment). A connector 308 such as, for example, an SMT connector (e.g., a Ball Grid Array (BGA) connector in this embodiment) is mounted to the board structure members 306 using solder balls 309 and/or other methods known in the art. A system component 310 (e.g., a processing system in this embodiment) is mounted to the connector 308 and coupled through the connector 308 to the connection pads 306, vias 306a, connection pads 306b, and/or other features in the board 302. As such, the system component 310 (e.g., a processing system) may be the transmitter 204 and/or receiver 206 of FIG. 2 and thus may transmit and/or receive data through the differential trace pair 208 as described in further detail below. However, in other embodiments, the board structure 300 may not couple to a connector and a system component (i.e., the board structure 300 may be non-communication structure that simply provides a trace-routing obstruction in the board 302) while remaining within the scope of the present disclosure. An internal plane 312 is included in the board 302 and defines a plurality of anti-pads 312a adjacent each of the vias 306a, as discussed in further detail below.

Figure 4:
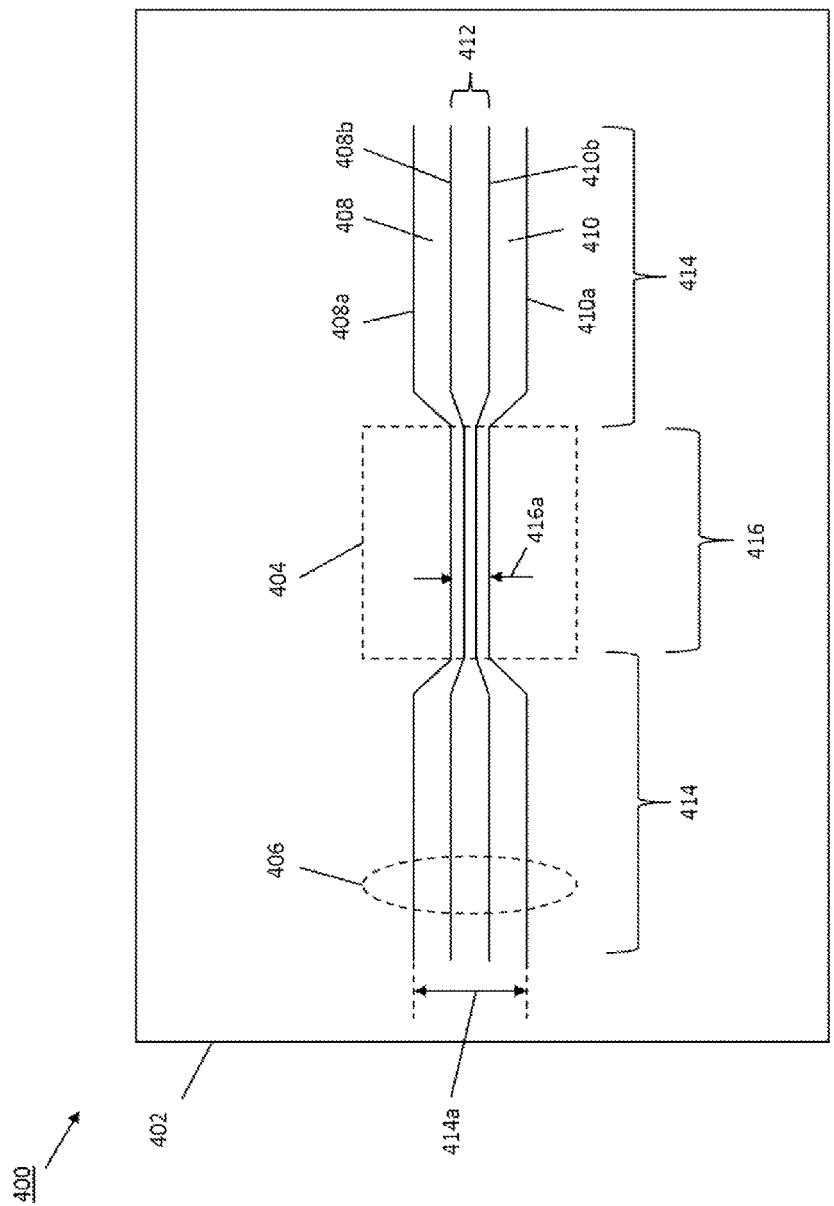
FIG. 4 is a schematic view illustrating an embodiment of a differential trace pair in the differential trace system of FIG. 2, including a neck-down region provided through the board structure of FIGS. 3a and 3b

Referring now to FIG. 4, an embodiment of a differential trace pair route 400 is illustrated. In the embodiment of FIG. 4, the differential trace pair route 400 includes a board 402, which may be the board 202 discussed above with reference to FIG. 2 or the board 302 discussed above with reference to FIGS. 3a and 3b. The board 402 includes a board structure 404 that may be the board structure 300 discussed above with reference to FIGS. 3a and 3b. A differential trace pair 406 is provided in the board 402 and is routed through the board structure 404 as illustrated. The differential trace pair 406 includes a first trace 408 that provides a first outer edge 408a of the differential trace pair 406 and that includes a first inner edge 408b that is located opposite the first trace 408 from the first outer edge 408a. The differential trace pair 406 also includes a second trace 410 that provides a second outer edge 410a of the differential trace pair 406 and that includes a second inner edge 410b that is located opposite the second trace 410 from the second outer edge 410a. The first trace 408 and the second trace 410 in the differential trace pair 406 define a differential trace pair spacing 412 between the first inner edge 408b and the second inner edge 410b. The differential trace pair 406 includes first differential trace portions 414 that are located outside of the board structure 404 and that includes a first width 414a, and a second differential trace portion 416 that extends through the board structure 404 and that includes a second width 416a that is less than the first width 414a. In the illustrated embodiment, the second differential trace portion 416 may be referred to as a "neck-down" region of the differential trace pair 406 that allows the differential trace pair 406 to be routed through board structure members in the board structure 404, discussed in further detail below. However, as discussed and illustrated below, such neck-down regions may also be used to route the differential trace pair 406 into a board structure to connect the differential trace pair 406 to one or more board structure members. While a specific differential trace pair has been illustrated and described, one of skill in the art in possession of the present disclosure will recognize that differential trace pairs may include a variety of different features (e.g., turns, different transitions, etc.) while remaining within the scope of the present disclosure.

One of skill in the art in possession of the present disclosure will recognize that the differential trace pair 406 will include an impedance that depends, at least in part, on the width of the traces (e.g., the first trace 408 and the second trace 410) in the differential trace pair 406, the spacing (e.g., the differential trace pair spacing 412) between the traces, the data transmission speed of the differential trace pair 406, as well as other factors (e.g., the dielectric constant of the traces, the loss dielectric materials of the traces, etc.). As discussed below, the widths of the first trace 408, the second trace 410, and the differential trace spacing 412 of the first differential trace pair portion(s) 414 of the differential trace pair 406 may provide a first impedance at a particular data transmission speed (e.g., 25 G), and the widths of the first trace 408, the second trace 410, and the differential trace spacing 412 of the second differential trace pair portion 416 of the differential trace pair 406 may be selected to provide a second impedance at that particular data transmission speed that is the same as, matches, or is otherwise substantially similar to the first impedance in order to eliminate, reduce, or otherwise minimize impedance discontinuities that can result in losses such as, for example, return losses, insertion loss, and/or other losses known in the art. However, as discussed above, reductions in the width of the first trace 408 and the second trace 410 is limited by the ability to produce traces of such widths with desirable characteristics, and thus the second differential trace pair portion 416 of the differential trace pair 406 may include the features below in order to address the limitations in reducing the width of traces below a certain amount while still providing for the substantial matching of impedance along the differential trace pair 406.

Figure 5:
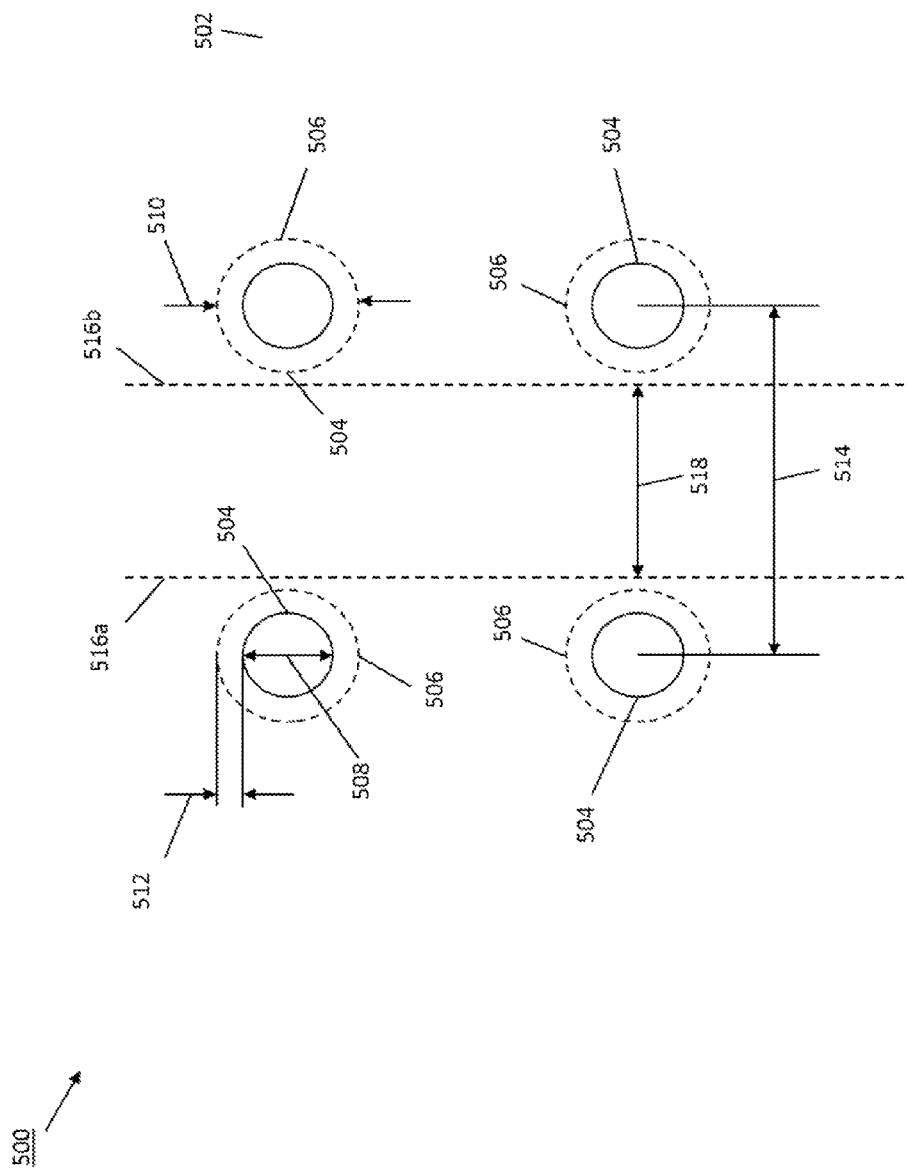
FIG. 5 is a schematic view illustrating an embodiment of the board structure of FIGS. 3a and 3b.

Referring now to FIG. 5, an embodiment of a connection pad array 500 (i.e., a board structure) is provided for reference to experimental embodiments that are discussed below that illustrate the benefits provided by the systems and methods of the present disclosure. In those experimental embodiments, the connection pad array 500 was substantially similar to the embodiment of the board structure 300 of FIG. 3b and was used to connect a BGA connector to a circuit board for mounting a processing system to the circuit board. The connection pad array 500 is provided on a board 502 and, in the illustrated embodiment, includes connection pads 504 that are coupled to vias (not illustrated, but similar to the vias illustrated in FIG. 3b) that are located respective anti-pads 506 that are included in the board 502 as discussed above (and thus illustrated by the dashed lines in FIG. 5). Each of the connection pads 504 includes a diameter 508 that, in the experimental embodiments discussed below, was 20 mils. Each of the anti-pads 510 includes a diameter 510 that, in the experimental embodiments discussed below, was 26 mils, thus providing the anti-pads 506 extended (opposite the board 502 from the connection pads 504) beyond the perimeter of the connection pads 504 by a distance 512 of 3 mils. The connection pads 504 include a spacing 514 or pitch (e.g., a center-to-center distance) between each other that, in the experimental embodiments discussed below, was 39.37 mils (i.e., 1 millimeter). Conventionally, 4 mils of trace clearance is desired from the edge of each connection pad 504 to account for the presence of the anti-pads 506 and, as such, a first clearance 516a and a second clearance 516b are provided spaced-apart from the connection pads 504 to define a differential trace pair routing channel between them with a width 518 that, in the experimental embodiments discussed below, was 11.37 mils (e.g., (the 39.37 mils spacing of the connection pads)−(2*(the 10 mil radius of each connection pad))−(2*(the 4 mil anti-pad clearance for each anti-pad)).

Figure 6:
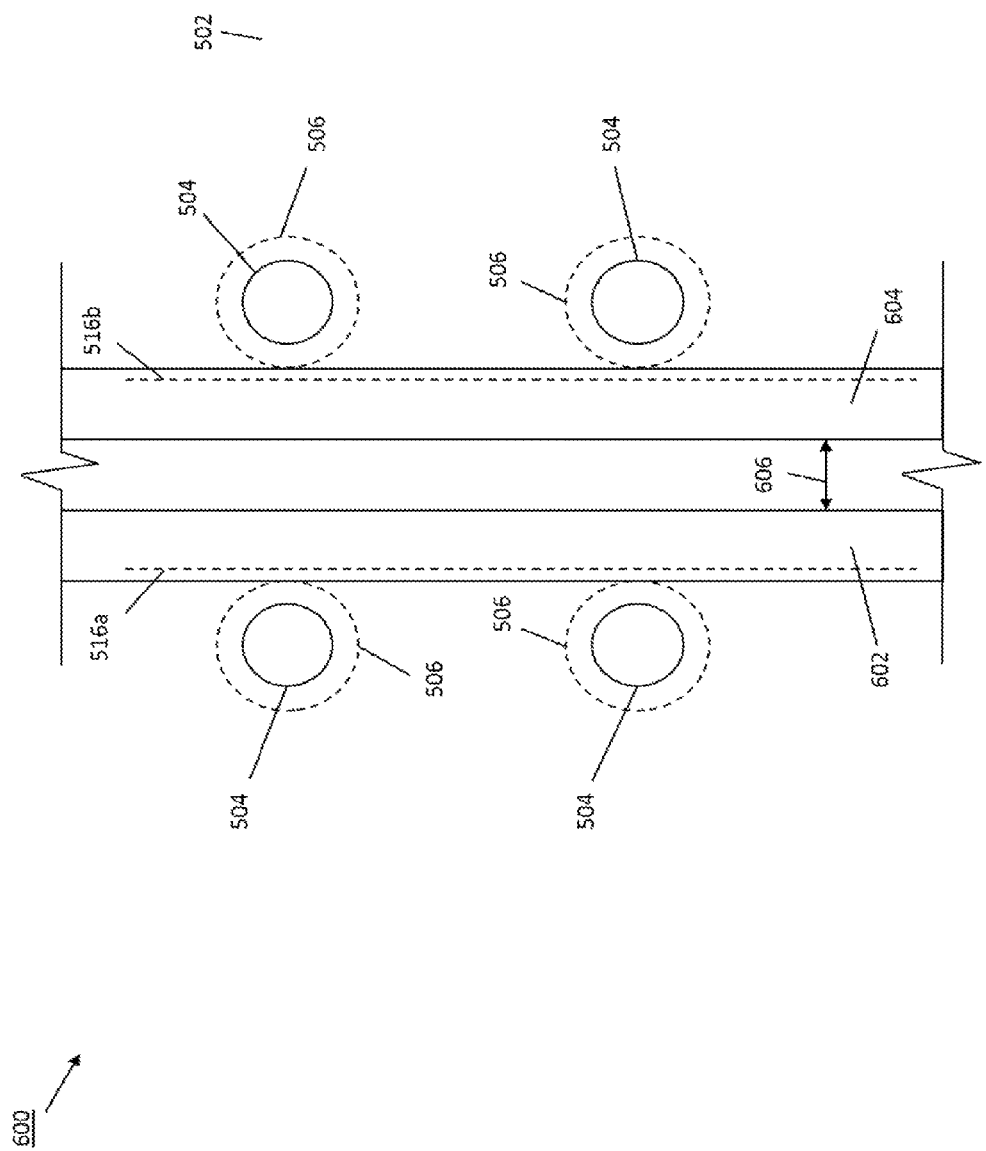
FIG. 6 is a schematic view illustrating an experimental embodiment of a conventional differential trace pair provided through the board structure of FIG. 5.

Referring now to FIG. 6, an experimental embodiment is illustrated that utilized a conventional differential trace pair through the board structure of FIG. 5. As discussed below, embodiments of the systems and methods of the present disclosure structure the neck-down region of the differential trace pair in a manner that provides traces at a width that is feasible for conventional manufacturing techniques, while substantially matching the impedance of the differential trace pair outside the neck-down region and also addressing the limited routing area between board structure members that require the neck-down region. In order to illustrate the benefits of the systems and methods of the present disclosure, the experimental embodiment illustrated in FIG. 6 is provided as a comparison of conventional techniques that are improved on by the experimental embodiments illustrated in FIGS. 8 and 9, as further shown in the chart of FIG. 10, as discussed below.

In the experimental embodiment illustrated in FIG. 6, and with reference to the dimensions of the board structure 500 discussed above in FIG. 5, a conventional differential trace pair 600 is illustrated. With reference to FIG. 4, the differential trace pair 600 illustrated in FIG. 6 may be part of the second differential trace pair portion 416, and the first differential trace pair portion(s) 414 of the differential trace pair 600 is/are not illustrated in FIG. 6. However, in conventional differential trace pair systems, the width of each of the first trace 408, the second trace 410, and the differential trace pair spacing 412 may be provided at 8 mils in order to provide a 92 ohm impedance when transmitting at 25 G differential data transmission rates using Megatron6 dielectric materials. As such, the total width 414a of the differential trace pair 600 in the first differential trace pair portion(s) 414 (e.g., from the first outer edge 408a to the second outer edge 410a) is 24 mils, which greatly exceeds the 11.37 mil differential trace routing channel discussed above, and even the 19.37 mil spacing available between the edges of the connection pads 504 when not accounting for the anti-pads 506.

FIG. 6 illustrates an experimental embodiment in which the second differential trace pair portion 416 (i.e., the "neck-down region") of the differential trace pair 600 was provided using conventional techniques such that the width of each of the first trace 602, the second trace 604, and the differential trace pair spacing 606 was 4 mils. As such, the width 416a of the differential trace pair 600 in the second differential trace pair portion 416 was 12 mils, which also exceeds the 11.37 mil differential trace routing channel discussed above. However, it has been found that using a 12 mil total differential trace pair width between the board structure members 504 that slightly overlaps the first clearance 516a and second clearance 516 does not cause problems with the anti-pads 506. However, the differential trace pair 600 in the first differential trace pair portion 416 with the 4 mil width of each of the first trace 602, the second trace 604, and the differential trace pair spacing 606 provides an impedance of 104 ohms when transmitting at 25 G differential data transmission rates. As such, the structure of the differential trace pair 600 in the second differential trace pair portion 416 provides an impedance discontinuity with the structure of the differential trace pair 600 in the first differential trace pair portion(s) 414 (e.g., a jump in impedance from 92 ohms to 104 ohms), and that impedance discontinuity has been found to produce signal reflections, return loss, insertion loss, and/or a variety of other issues that result in degradation of the Bit Error Rate (BER) and Eye Diagram and reduce the margin for detecting errors in data transmission and reception. While a specific experimental embodiment is illustrated and described in FIG. 6, one of skill in the art will recognize how the impedance discontinuity provided by the neck-down region in a differential trace pair may different depending on the differing geometries, dielectric constant values, and/or other characteristics of the differential trace pair.

Furthermore, the manufacture of relatively small traces (e.g., the 4 mil and smaller widths discussed above) has been found to raise some issues when utilizing conventional trace manufacturing techniques. Such width reductions of the traces can exacerbate the losses discussed above. When the losses of the differential trace pair exceed Institute of Electrical and Electronics Engineers (IEEE) 802.3bj loss budgets (e.g., 30 dB without Forward Error Correction (FEC) and 35 dB with FEC), re-timer Application Specific Integrated Circuits (ASICs) must be added to the system, thus increasing costs and complexity. Such width reductions also introduce difficulties in holding trace geometry tolerances, resulting in a reduction in circuit board tolerances. All of these issues can result in the impedance of the differential trace pair varying more than 10%, and 25 G transmission rate differential trace pairs need tolerances in the range of 5-8%.

Figure 7:
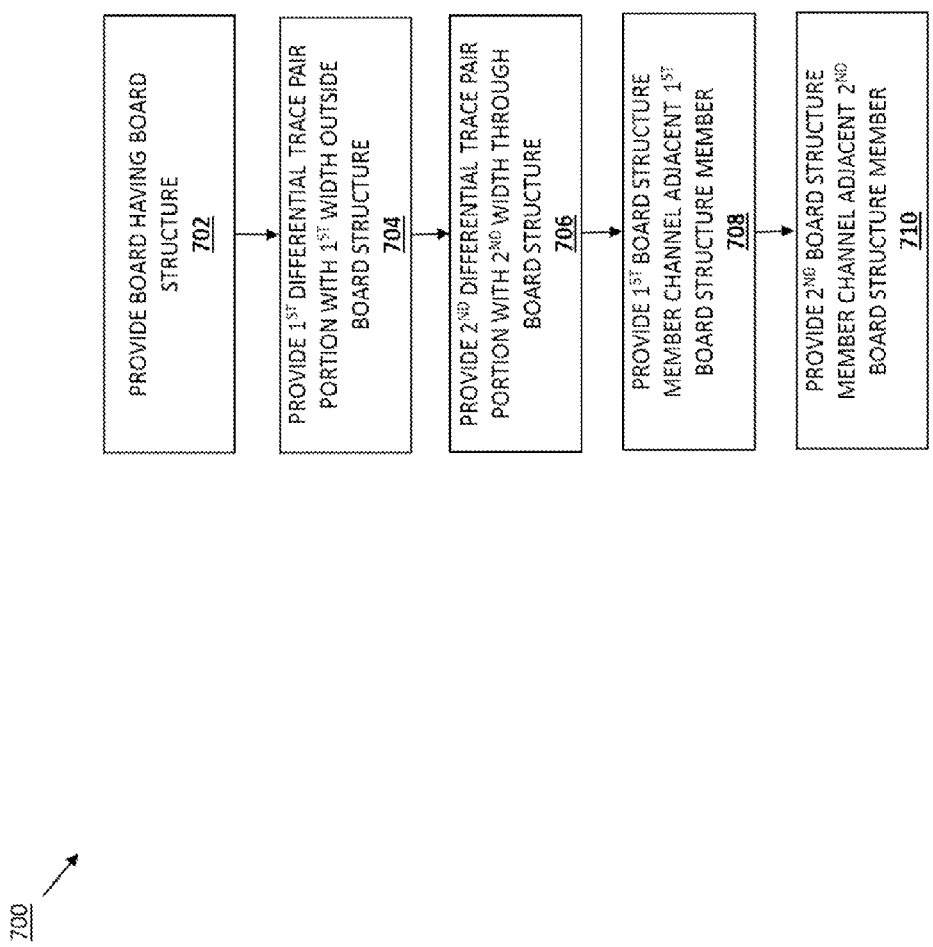
FIG. 7 is a flow chart illustrating an embodiment of a method for providing a differential trace pair.
Figure 8:
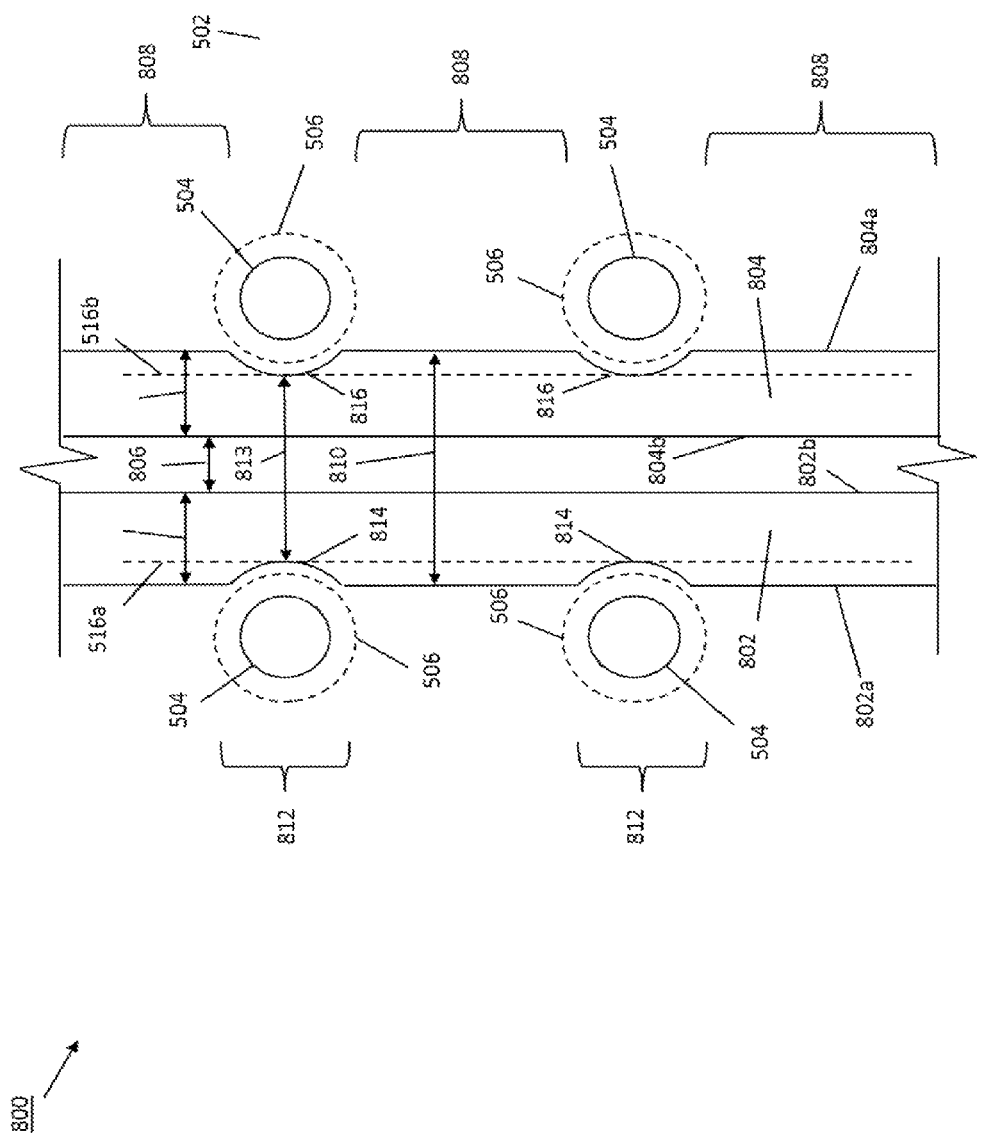
FIG. 8 is a schematic view illustrating an embodiment of a differential trace pair provided through the board structure of FIG. 5.

Referring now to FIGS. 7 and 8, an embodiment of a method 100 for providing a differential trace pair is illustrated. FIG. 8 illustrates the differential trace pair 800 provided according to the method 700, and as such the features of the differential trace pair 800 will be discussed along with their provisioning according to the blocks of the method 700. Furthermore, an experimental embodiment of the differential trace pair 800 will be discussed in detail with reference to the experimental embodiment of the differential trace pair 600 discussed above in order to illustrate the benefits of the systems and methods of the present disclosure over conventional differential trace pair systems and methods. The method 700 begins at block 702 where a board having a board structure is provided. In the discussions below, the board 502 having the connection pad array 500 illustrated in FIG. 5 is provided, and that board 502 may include the features of the board structure 300 of FIGS. 3a and 3b and the differential trace pair route 400 of FIG. 4. As would be understood by one of skill in the art in possession of the present disclosure, the board 502 may be provided in a variety of board manufacturing and/or trace routing systems known in the art.

The method 700 then proceeds to block 704 where a first differential trace pair portion with a first width is provided outside of a board structure. Referring to FIG. 4, the first differential trace pair portion 414 of the differential trace pair 406 may be provided with a first width 414a outside the board structure 404. Similarly as discussed above with the experimental embodiment of the differential trace pair 600 in FIG. 6, the first differential trace pair portion 414 may be provided with the first trace 408 having a width of 8 mils, the second trace 410 having a width of 8 mils, and the differential trace pair spacing 412 having a width of 8 mils, such that the width 414a of the differential trace pair 406 in the first differential trace pair portion 414 is 24 mils. As such, the differential trace pair 406 in the first differential trace pair portion 414 may provide a 92 ohm impedance when transmitting at 25 G differential data transmission rates using Megatron 6 dielectric materials. Furthermore, the first differential trace pair portion(s) 414 may be provided for the differential trace pair 406 at any points between the transmitter (e.g., the transmitter 204 in FIG. 2) and the receiver (e.g., the receiver 206 in FIG. 2) that do not include board structures.

The method 700 then proceeds to block 706 where a second differential trace pair portion with a second width is provided through a board structure. Referring to FIG. 4, in an embodiment, the second differential trace pair portion 416 of the differential trace pair 406 may be provided through the board structure 404 with a second width 416a that is smaller than the first width. FIG. 8 illustrates a differential trace pair 800 that may be the second differential trace pair portion 416 of the differential trace pair 406 provided through the board structure 404 in FIG. 4. The differential trace pair 800 includes a first trace 802 having a first outer edge 802a and a first inner edge 802b located opposite the first trace 802 from the first outer edge 802a, a second trace 804 having a second outer edge 804a and a second inner edge 804b located opposite the second trace 804 from the second outer edge 804a, and a differential trace pair spacing 806 defined between the first inner edge 802b and the second inner edge 804b. As can be seen in FIG. 8, the second differential trace pair portion of the differential trace pair 800 illustrated in FIG. 8 includes sections 808 that are not between the board structure members 504 and that have a width 810 (e.g., the second width that is smaller than the first width of the first differential trace pair portion of the differential trace pair 800).

As discussed above, in an experimental embodiment of FIG. 8, the first width 414a of the first differential trace pair portion 414 of the differential trace pair 406 was 24 mils, including 8 mil widths of the first trace 408, the second trace 410, and the differential trace pair spacing 412. In that experimental embodiment, in the second differential trace pair portion 416 the first trace 802 was provided with a width 802c of 4.875 mils, the second trace 804 was provided with a width 804c of 4.875 mils, and the differential trace spacing 806 was provided with a width of 3.125 mils. With such dimensions, the sections 808 of the differential trace pair 800 provide a 92 ohm impedance when transmitting at 25 G differential data transmission rates, which is the same as, matched with, and/or substantially similar to the 92 ohm impedance provided by the first differential trace pair portion 414 of the differential trace pair 406/800 as discussed above. As can be seen, such dimensions provide the width 810 (i.e., the second width) of 12.875 mils, which is greater than the 11.37 mil differential trace routing channel discussed above and causes the first outer edge 802a to extend past the first clearance 516a and the second outer edge 804a to extend past the second clearance 516b. However, similarly as discussed above, it has been found that using a 12.875 mil total differential trace pair width between the board structure members 504 that slightly overlaps the first clearance 516a and second clearance 516 does not cause problems with the anti-pads 506. Furthermore, those dimensions may provide an impedance match between the first differential trace pair portion 414 of the differential trace pair 800 and the sections 808 of the second differential trace pair portion 416 of the differential trace pair 800, thus eliminating the impedance discontinuity between those portions of the differential trace pair 800 relative to conventional systems and methods. As such, the sections 808 of the differential trace pair 800 may be provided with a width that is not subject to the issues associated with providing relatively thin traces, and dimensioned such that they provide an impedance that is substantially matched to the impedance of the portion(s) of the larger width portions of the differential trace pair 800 that are outside of the board structure.

The method 700 the proceeds to blocks 708 and 710 where a first board structure member channel is provided adjacent a first board structure member, and a second board structure member channel is provided adjacent a second board structure member. In an embodiment, board structure member channels may be defined in the portions of the trace immediately adjacent that board structure members such that portions of the differential trace pair adjacent the board structure members are provided a third width that is less than the second width. While the provision of the board structure member channels is illustrated and discussed with regard to the method 700 as occurring after the provision of the traces in the differential trace pair (e.g., by etching), one of skill in the art in possession of the present disclosure will recognize that the traces in the differential trace pair may be provided with the board structure member channels using other techniques (e.g., masks, etc.) while remaining within the scope of the present disclosure.

With reference to FIG. 8, the differential trace pair 800 includes sections 812 that are located between the connection pads 504 and that reduce in width from the width 810 to a width 813 by defining a plurality of first board structure member channels 814 that extend into the first outer edge 802a of the first trace 802 immediately adjacent the connection pads 504, and by defining a plurality of second board structure member channels 816 that extend into the second outer edge 804a of the second trace 804 immediately adjacent the connection pads 504. For example, continuing with the experimental embodiment discussed above, the first board structure member channels 814 reduced the width of the first trace 802 from 4.875 mils to 4.4375 mils, the second board structure member channels 816 reduced the width of the second trace 804 from 4.875 mils to 4.4375 mils, and the width of the differential trace pair spacing 806 remained the same at 3.125 mils. While such reduction in width of the traces 802 and 804 changed the impedance of the sections 812 of the differential trace pair 800 from 92 ohms to 95 ohms, that slight mismatch in impedance over the relatively small length of the connection pads 504 has been found to not result in any major issues with regard to signal reflections, return loss, insertion loss, and/or other issues that result in degradation of the Bit Error Rate (BER) and Eye Diagram and reduce the margin for detecting errors in data transmission and reception.

In the illustrated embodiment, the board structure member channels are provided as arcs that extend into the outer edges 802a and 804a of the traces 802 and 804, respectively, and up to the clearances 516a and 516b, respectively, such that the traces 802 and 804 do not overlap the anti-pads 506. However, the shape, depth, and/or other dimensions of the board structure member channels may be dimensioned in a variety of different manners to address different sizes, shapes, and types of board structure members while ensuring that any impedance discontinuities produced in the differential trace pair as a result of the changes in dimension are minimal enough such that they do not produce the negative issues discussed above. As such, the specific embodiment illustrated in FIG. 8 is merely provided as an example, and one of skill in the art in possession of the present disclosure will recognize that the techniques provided herein may be modified based on boards, board structures, board structure members, differential trace pair requirements, board stacks, and/or a variety of other system characteristics known in the art while achieving similar benefits as discussed above and remaining within the scope of the present disclosure.

Figure 9:
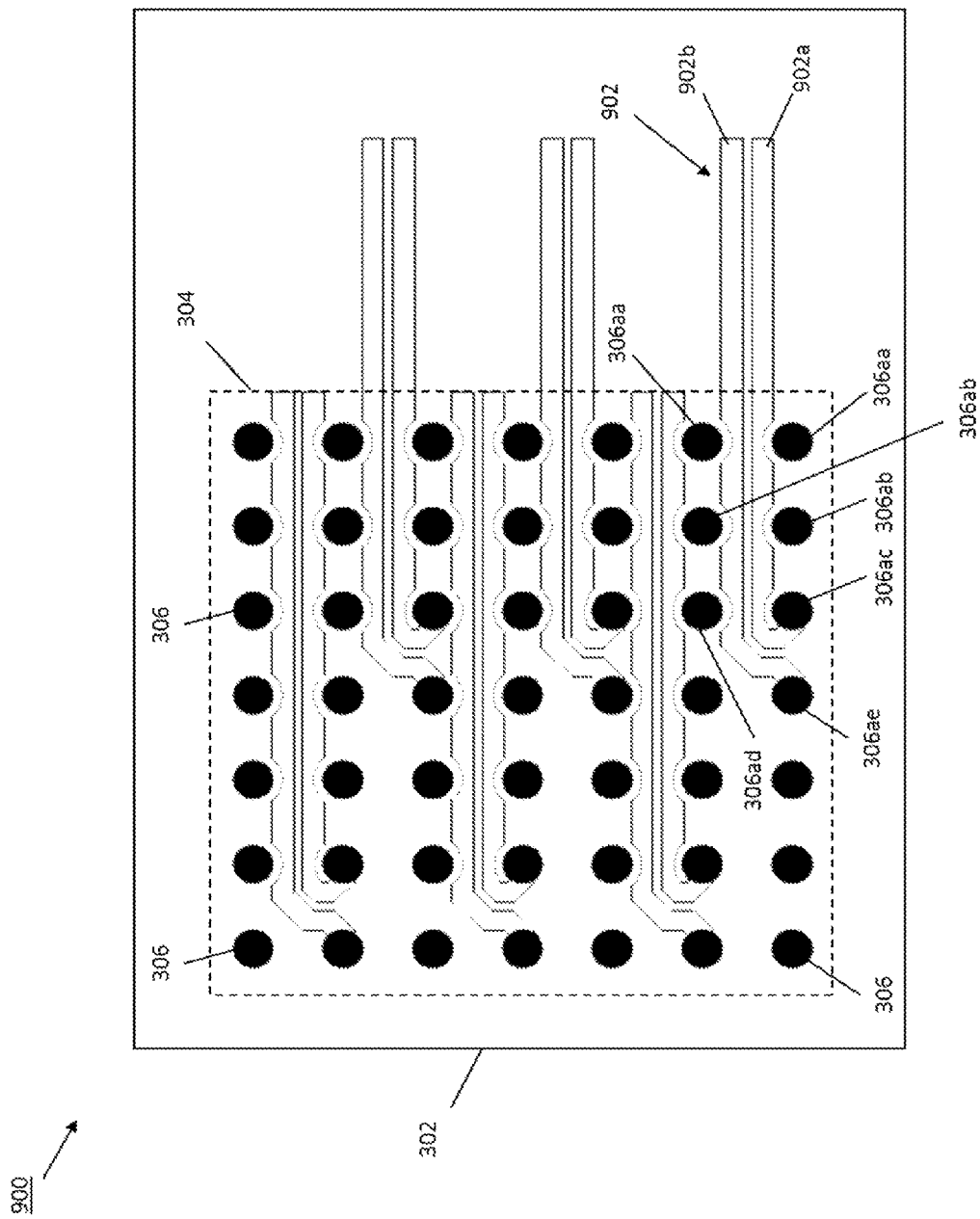
FIG. 9 is a schematic view illustrating an embodiment of a differential trace pair provided through the board structure of FIGS. 3a and 3b.

Referring now to FIG. 9, an embodiment of a differential trace pair system 900 is illustrated to provide an example of a differential trace pair provided according to the teachings of the present disclosure in the board structure 300 of FIGS. 3a and 3b. The differential trace pair system 900 includes a plurality of differential trace pairs, including a differential trace pair 902 that is provided on the board 302, that includes a first trace 902a and a second trace 902b, and that extends into the board structure area 304. As can be seen, within the board structure area 304, the differential trace pair 902 includes board structure member channels that provide for reductions in width (e.g., from the outer edges of the first trace 902a and second trace 902b) between a pair of board structure members 306aa, between a pair of board structures 306ab, and between a pair of board structures 306ac and 306ad. In addition, the first trace 902a connects to the board structure member 306ac (e.g., a connection pad), and the second trace 902b connects to the board structure member 306ae (e.g., a connection pad).

Figure 10:
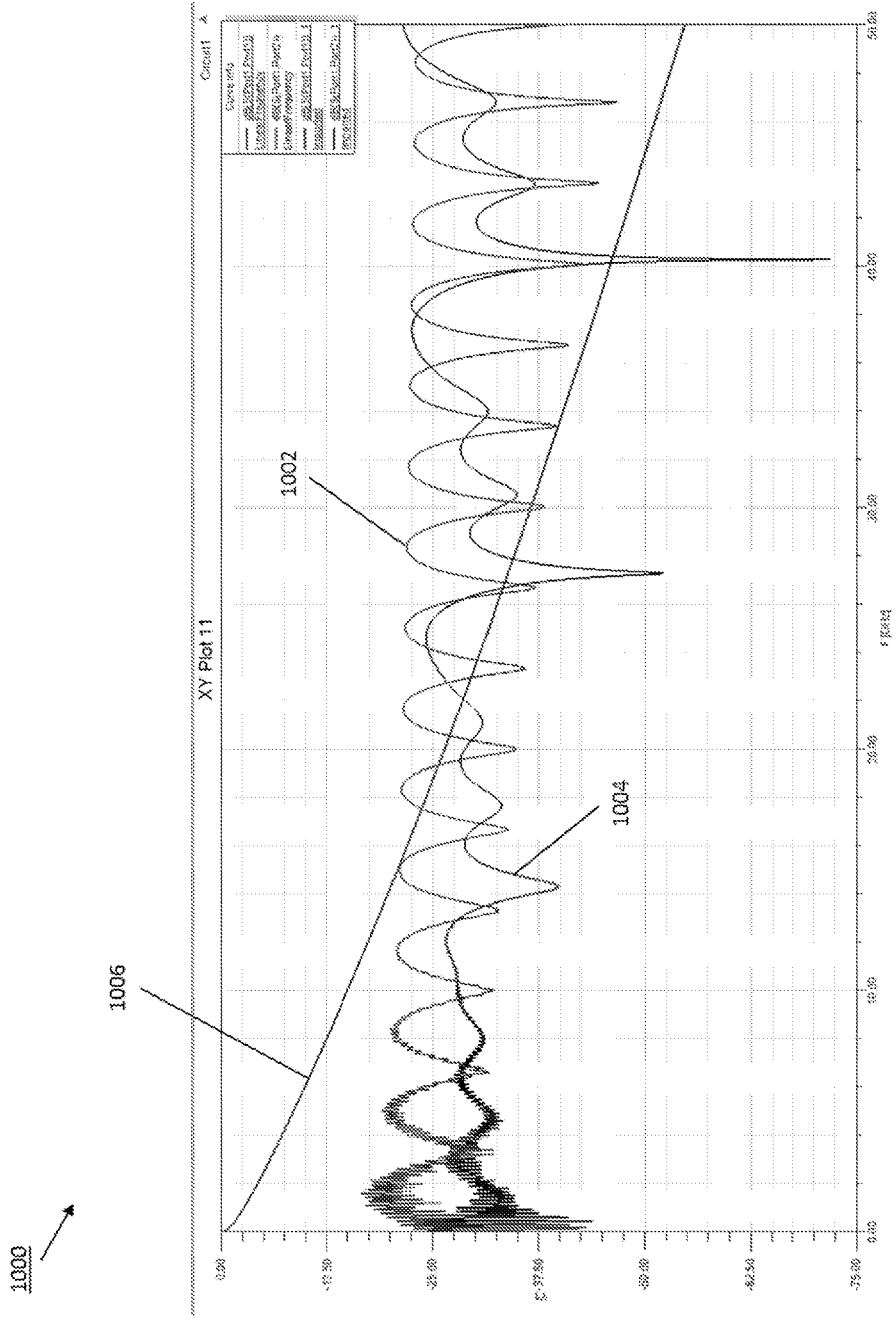
FIG. 10 is a graph illustrating an embodiment of losses due to neck-down regions in differential trace pairs provided conventionally vs. provided using the systems and methods of the present disclosure.

Referring now to FIG. 10, a graph 1000 is provided that illustrates some of the benefits of the systems and methods of the present disclosure. The graph 1000 plots losses between a transmitter and a receiver using a differential trace pair with neck-down regions that provide for connection to the transmitter and the receiver via the conventional methods discussed above with reference to FIG. 6, and the methods discussed above with reference to FIGS. 8 and 9. Specifically, the differential trace pair was provided with 20 inches of non-neck-down region (i.e., full width) traces and spacing, along with 1.02 inch neck-down regions through connection pad arrays that connected to each of the transmitter and receiver. The conventional neck-down embodiment 1002 (as illustrated in FIG. 6) is plotted on the graph 1000 of loss vs. frequency, while the neck-down embodiment 1004 of the present disclosure (as illustrated in FIGS. 8 and 9) are plotted on the same graph 1000. Insertion losses are indicated by line 1006, which was substantially overlapping for each of the neck-down embodiments that are plotted in the graph 1000 at the scale illustrated in FIG. 10. As can be seen, the return losses over the frequency range illustrated in FIG. 10 were less for the neck-down embodiment 1004 according to the present disclosure relative to conventional neck-down embodiment 1002.

Thus, systems and methods for providing differential trace pairs have been described that provide for the routing of differential trace pairs through board structures while minimizing impedance discontinuities that result from conventional differential trace pair routing techniques. Such benefits are realized by providing a reduced-width, neck-down region of a differential trace pair in a board structure with dimensions that match the impedance of the differential trace pair outside of the board structure, and then defining channels in the differential trace pair in the neck-down region immediately adjacent the board structure members such that the differential trace pair "fits" between board structure members. As such, differential trace pairs may be routed through board structures and into board structures to connect to transmitters and/or receivers without the manufacturing difficulties associated with providing relatively thin traces, and/or the degradation that can result with mismatched impedances in different sections of the differential trace pair.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A differential trace pair system, comprising:
a board including a board structure having a first board structure member and a second board structure member that is spaced part from the first board structure member; and
a differential trace pair that is provided in the board and that includes:
a first differential trace pair portion located outside the board structure, having a first width, and configured to provide a first impedance at a data transmission speed; and
a second differential trace pair portion that extends through the board structure, and that includes:
a primary width section in the second differential trace pair portion that is configured to provide a second impedance at the data transmission speed that is substantially similar to the first impedance, and that includes a first outer edge and a second outer edge that is located opposite the second differential trace pair portion from the first outer edge, wherein the first outer edge and the second outer edge define a second width; and
a reduced width section in the second differential trace pair portion that is configured to provide a third impedance at the data transmission speed that is substantially similar to the first impedance and the second impedance, and that includes:
a first board structure member channel that is defined by the first outer edge adjacent the first board structure member, that maintains substantially the same spacing between the first outer edge and the first board structure member, and that provides for a transition of the second differential trace pair portion from the second width to a third width and then back to the second width, wherein the third width is smaller than the second width; and
a second board structure member channel that is defined by the second outer edge adjacent the second board structure member, that maintains substantially the same spacing between the second outer edge and the second board structure member, and that provides for a transition of the second differential trace pair portion from the second width to the third width and then back to the second width.

2. The differential trace pair system of claim 1, wherein the differential trace pair includes:
a first differential trace that includes the first outer edge and a first inner edge located opposite the first differential trace from the first outer edge; and
a second differential trace that includes the second outer edge and a second inner edge that is located opposite the second differential trace from the second outer edge, and wherein the first inner edge and the second inner edge are substantially parallel along a length of the second differential trace pair portion including the primary width section having the second width and the reduced width section having the third width.

3. The differential trace pair system of claim 1, wherein the first differential trace pair portion includes a first differential trace pair spacing between a first differential trace and a second differential trace that are included in the differential trace pair, and the second differential trace pair portion includes a second differential trace pair spacing between the first differential trace and the second differential trace that is substantially similar to the first differential trace pair spacing.

4. The differential trace pair system of claim 3, wherein the first differential trace, the second differential trace, and the second differential trace pair spacing that provide the reduced width section of the second differential trace pair portion are configured to provide the third impedance that is no more than 8% greater than the first impedance of the first differential trace pair portion and the second impedance of the primary width section in the second differential trace pair portion.

5. The differential trace pair system of claim 1, wherein the first board structure member includes a first connection pad, and the second board structure member include a second connection pad.

6. The differential trace pair system of claim 5, further comprising:
   a first clearance area defined adjacent the first connection pad, and a second clearance area defined adjacent the second connection pad, wherein the second differential trace pair portion extends into the first clearance area and the second clearance area.

7. The differential trace pair system of claim 1, further comprising:
   a third board structure member and a fourth board structure member included on the board structure, wherein the second differential trace pair portion is connected to the third board structure member and the fourth board structure member.

8. An information handling system (IHS), comprising:
   a processor;
   a circuit board having a connection pad array that couples the processor to the circuit board, wherein the connection pad array includes a first connection pad and a second connection pad that is spaced apart from the first connection pad; and
   a differential trace pair that is provided in the circuit board and that includes:
     a first differential trace pair portion located outside the connection pad array, having a first width, and configured to provide a first impedance at a data transmission speed; and
     a second differential trace pair portion that extends through the connection pad array, and including:
       a primary width section in the second differential trace pair portion that is configured to provide a second impedance at the data transmission speed that is substantially similar to the first impedance, and that includes a first outer edge and a second outer edge that is located opposite the second differential trace pair portion from the first outer edge, wherein the first outer edge and the second outer edge define a second width; and
       a reduced width section in the second differential trace pair portion that is configured to provide a third impedance at the data transmission speed that is substantially similar to the first impedance and the second impedance, and that includes:
         a first connection pad channel that is defined by the first outer edge adjacent the first connection pad, that maintains substantially the same spacing between the first outer edge and the first connection pad, and that provides for a transition of the second differential trace pair portion from the second width to a third width and then back to the second width, wherein the third width is smaller than the second width; and
         a second connection pad channel that is defined by the second outer edge adjacent the second connection pad, that maintains substantially the same spacing between the second outer edge and the second connection pad, and that provides for a transition of the second differential trace pair portion from the second width to the third width and then back to the second width.

9. The IHS of claim 8, wherein the differential trace pair includes:
   a first differential trace that includes the first outer edge and a first inner edge located opposite the first differential trace from the first outer edge, and
   a second differential trace includes the second outer edge and a second inner edge that is located opposite the second differential trace from the second outer edge, and wherein the first inner edge and the second inner edge are substantially parallel along a length of the second differential trace pair portion including the primary width section having the second width and the reduced width section having the third width.

10. The IHS of claim 8, wherein the first differential trace pair portion includes a first differential trace pair spacing between a first differential trace and a second differential trace that are included in the differential trace pair, and the second differential trace pair portion includes a second differential trace pair spacing between the first differential trace and the second differential trace that is substantially similar to the first differential trace pair spacing.

11. The IHS of claim 10, wherein the first differential trace, the second differential trace, and the second differential trace pair spacing that provide the reduced width section of the second differential trace pair portion are configured to provide the third impedance that is no more than 8% greater than the first impedance of the first differential trace pair portion and the second impedance of the primary width section in the second differential trace pair portion.

12. The IHS of claim 8, further comprising:
   a Ball Grid Array (BGA) engaging the connection pad array, wherein the processor is mounted to the BGA.

13. The IHS of claim 8, further comprising:
   a first clearance area defined adjacent the first connection pad, and a second clearance area defined adjacent the second connection pad, wherein the second differential trace pair portion extends into the first clearance area and the second clearance area.

14. The IHS of claim 8, further comprising:
   a third connection pad and a fourth connection pad included on the connection pad array, wherein the second differential trace pair portion is connected to the third connection pad and the fourth connection pad.

15. A method for providing a differential trace pair, comprising:
   providing a board including a board structure having a first board structure member and a second board structure member that is spaced part from the first board structure member;
   creating a first differential trace pair portion of a differential trace pair in the board and outside the board structure, wherein the first differential trace pair portion includes a first width and is configured to provide a first impedance at a data transmission speed;
   creating a second differential trace pair portion of the differential trace pair in the board that extends from the first differential trace pair portion and through the board structure, and that includes:
  a primary width section in the second differential trace pair portion that is configured to provide a second impedance at the data transmission speed that is substantially similar to the first impedance, wherein the primary width section includes a first outer edge and a second outer edge that is located opposite the second differential trace pair portion from the first outer edge, and wherein the first outer edge and the second outer edge define a second width of the second differential trace pair portion that is different than the first width;
  creating a reduced width section in the second differential trace pair portion that is configured to provide a third impedance at the data transmission speed that is substantially similar to the first impedance and the second impedance, wherein the creating the reduced width section in the second differential trace pair portion includes:
    defining a first board structure member channel in the first outer edge adjacent the first board structure member, wherein the first board structure member channel maintains substantially the same spacing between the first outer edge and the first board structure member, and wherein the first board structure member channel provides for a transition of the second differential trace pair portion from the second width to a third width and then back to the second width, and wherein the third width is smaller than the second width; and
    defining a second board structure member channel in the second outer edge adjacent the second board structure member, wherein the second board structure member channel maintains substantially the same spacing between the second outer edge and the second board structure member, and wherein the second board structure member channel provides for a transition of the second differential trace pair portion from the second width to the third width and then back to the second width.

16. The method of claim 15, further comprising:
providing a first differential trace in the second differential trace pair portion that includes the first outer edge and a first inner edge located opposite the first differential trace from the first outer edge; and
providing a second differential trace in the second differential trace pair portion that includes the second outer edge and a second inner edge that is located opposite the second differential trace from the second outer edge, and the first inner edge and the second inner edge are substantially parallel along a length of the second differential trace pair portion including the primary width section having the second width and the reduced width section having the third width.

17. The method of claim 15, further comprising:
providing a first differential trace pair spacing between a first differential trace and a second differential trace that are included in the first differential trace pair portion; and
providing a second differential trace pair spacing between the first differential trace and the second differential trace that are included in the second differential trace pair portion, wherein the second differential trace pair spacing is substantially similar to the first differential trace pair spacing.

18. The method of claim 17, further comprising:
providing the first differential trace, the second differential trace, and the second differential trace pair spacing that provide the reduced width section of the second differential trace pair portion with the third impedance that is no more than 8% greater than the first impedance of the first differential trace pair portion and the second impedance of the primary width section in the second differential trace pair portion.

19. The method of claim 15, wherein the first board structure member includes a first connection pad and a first clearance area defined adjacent the first connection pad, the second board structure member include a second connection pad and a second clearance area defined adjacent the second connection pad, and the method further comprises:
providing the second differential trace pair portion extending into the first clearance area and the second clearance area.

20. The method of claim 15, wherein the board structure includes a third board structure member and a fourth board structure member, and the method further comprises:
connecting the second differential trace pair portion to the third board structure member and the fourth board structure member.

* * * * *